(12) United States Patent
Han et al.

(10) Patent No.: US 10,396,751 B2
(45) Date of Patent: Aug. 27, 2019

(54) ACOUSTIC WAVE FILTER DEVICE

(71) Applicant: SAMSUNG ELECTRO-MECHANICS CO., LTD., Suwon-si (KR)

(72) Inventors: Won Han, Suwon-si (KR); Tae Hun Lee, Suwon-si (KR); Dae Hun Jeong, Suwon-si (KR); Moon Chul Lee, Suwon-si (KR); Sang Uk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 140 days.

(21) Appl. No.: 15/384,385

(22) Filed: Dec. 20, 2016

(65) Prior Publication Data

US 2017/0366156 A1    Dec. 21, 2017

(30) Foreign Application Priority Data

Jun. 15, 2016    (KR) .................. 10-2016-0074351

(51) Int. Cl.
*H03H 9/02* (2006.01)
*H03H 9/17* (2006.01)
*H03H 9/54* (2006.01)

(52) U.S. Cl.
CPC .... *H03H 9/02007* (2013.01); *H03H 9/02086* (2013.01); *H03H 9/173* (2013.01); *H03H 9/174* (2013.01); *H03H 9/54* (2013.01)

(58) Field of Classification Search
CPC ........... H03H 9/02007; H03H 9/02086; H03H 9/0211; H03H 2009/02173; H03H 9/173; H03H 9/174; H03H 9/54; H03H 9/587; H03H 9/588; H03H 9/02118

USPC .................. 333/187, 188, 189; 310/312
See application file for complete search history.

(56) References Cited

U.S. PATENT DOCUMENTS

| | | | |
|---|---|---|---|
| 5,692,279 A | 12/1997 | Mang et al. | |
| 7,554,422 B2 * | 6/2009 | Nakatsuka | H03H 3/02 333/133 |
| 7,649,304 B2 * | 1/2010 | Umeda | H03H 3/04 310/312 |
| 7,675,389 B2 * | 3/2010 | Yamakawa | H03H 3/04 310/312 |
| 8,902,023 B2 | 12/2014 | Choy et al. | |
| 2002/0158716 A1 | 10/2002 | Pensala | |
| 2012/0068690 A1 | 3/2012 | Song et al. | |

(Continued)

FOREIGN PATENT DOCUMENTS

| | | |
|---|---|---|
| JP | 01-157108 A * | 6/1989 |
| JP | 2008-5443 A | 1/2008 |
| KR | 10-2016-0015628 A | 2/2016 |

OTHER PUBLICATIONS

Korean Office Action dated Apr. 27, 2017 in corresponding Korean patent application No. 10-2016-0074351 (13 pages with English translation).

(Continued)

*Primary Examiner* — Barbara Summons
(74) *Attorney, Agent, or Firm* — NSIP Law

(57) ABSTRACT

An acoustic wave filter device includes a lower electrode disposed between a substrate and a piezoelectric layer, an upper electrode disposed on the piezoelectric layer, and an insulating layer disposed on the upper electrode. The insulating layer exposes portions of the upper electrode.

11 Claims, 5 Drawing Sheets

(56) References Cited

U.S. PATENT DOCUMENTS

| | | | |
|---|---|---|---|
| 2014/0118087 A1* | 5/2014 | Burak | H03H 9/173 333/186 |
| 2014/0139077 A1* | 5/2014 | Choy | H03H 9/02118 310/365 |
| 2015/0244346 A1* | 8/2015 | Feng | H03H 9/02031 333/187 |
| 2016/0035960 A1 | 2/2016 | Lee et al. | |
| 2016/0163954 A1 | 6/2016 | Shin et al. | |

OTHER PUBLICATIONS

Korean Office Action dated Dec. 27, 2017 in corresponding Korean patent application No. 10-2016-0074351. ( 7 Pages in English and 6 Pages in Korean).

* cited by examiner

A

ACOUSTIC WAVE FILTER DEVICE

CROSS-REFERENCE TO RELATED APPLICATION

This application claims the benefit under 35 USC 119(a) of Korean Patent Application No. 10-2016-0074351 filed on Jun. 15, 2016 in the Korean Intellectual Property Office, the disclosure of which is incorporated herein by reference for all purposes.

BACKGROUND

1. Field

The present disclosure relates to an acoustic wave filter device.

2. Description of Related Art

Bulk acoustic wave (BAW) filter is a core element, passing radio signals having a desired frequency band among radio frequency (RF) signals therethrough and blocking signals having undesired frequencies in a front end module of an electronic device. With the growth of smartphones, tablet personal computers (PC), and similar devices, demand for a more efficient bulk acoustic wave (BAW) filter has increased.

Bulk acoustic wave (BAW) filters commonly include bulk acoustic wave resonators that can be described in terms of their Q (quality) factor. The Q performance describes how under-damped the resonator is and characterizes the resonator's bandwidth relative to its center frequency. Higher Q factor indicates a lower rate of energy loss relative to the stored energy of the resonator, i.e., the oscillations die out more slowly. High Q resonances are the basis of the frequency selectivity and low loss that BAW filters achieve.

In order to improve Q performance of bulk acoustic wave resonators, a frame is formed at a circumference of the bulk acoustic wave resonator to reflect lateral waves generated at the time of resonance to an inner portion of bulk acoustic wave resonators, thereby trapping resonant energy in the active area.

However, since the insulating layer deposited, as described above, is deposited over the entirety of the bulk acoustic wave resonator including the frame as well as the active area of the bulk acoustic wave resonator, reflection loss by the lateral waves are generated at the time of the resonance by the insulating layer formed on an outer surface of the frame, such that leakage of resonant energy is generated. As a result, Q performance deteriorates.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave filter device includes a lower electrode disposed between a substrate and a piezoelectric layer, an upper electrode disposed on the piezoelectric layer, and an insulating layer disposed on the upper electrode. The insulating layer exposes portions of the upper electrode.

A frame portion may extend from the upper electrode and has a thickness greater than an extension portion extending from the frame.

The insulating layer may expose side and upper surface portions of the frame portion.

The insulating layer may exposes a side surface portion of the frame portion

The insulating layer may extend and protrude from the frame portion.

The acoustic wave filter device may further include a lower electrode protecting layer disposed between the lower electrode and the substrate.

A cavity may be formed between the lower electrode protecting layer and the substrate, and the piezoelectric layer may be disposed on a portion of the lower electrode protecting layer.

The cavity may be formed by removing a sacrificial layer.

The lower electrode protecting layer and the lower electrode may have inclined portions.

The frame portion and the upper electrode may be formed of the same material.

The frame portion may have an encircling contour.

In another general aspect, an acoustic wave filter device includes a lower electrode protecting layer disposed on a substrate defining a cavity therebetween, a lower electrode disposed between the lower electrode protecting layer and a piezoelectric layer, an upper electrode disposed on the piezoelectric layer; and an insulating layer disposed to cover portions of the upper electrode. The insulating layer exposes a portion of the upper electrode.

A frame portion extending from the upper electrode may have a thickness greater than that of other portions of the upper electrode.

The insulating layer may have an exposure hole defining externally exposed portions of a side surface and an upper surface of the frame portion.

The frame portion and other portions of the upper electrode may be formed of the same material.

The frame portion has an encircling contour.

In another general aspect, an acoustic wave filter device includes a lower electrode and an upper electrode. The lower electrode is disposed between a substrate and a piezoelectric layer to form a cavity between the lower electrode and the substrate. The upper electrode is disposed on the piezoelectric layer. The upper electrode includes a first frame portion, a second frame portion, an extension portion and an end portion. The extension portion extends between the first frame portion and the second frame portion, and the end portion extends from the second frame portion. An insulating layer is disposed on upper surfaces of the second frame portion, the extension portion, the end portion, and a partial upper surface of the first frame portion.

The insulating layer may expose a side surface of the first frame portion.

The insulating layer may exposes side and upper surfaces of the first frame portion.

The first and second frame portions may each have a thickness greater than the extension portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
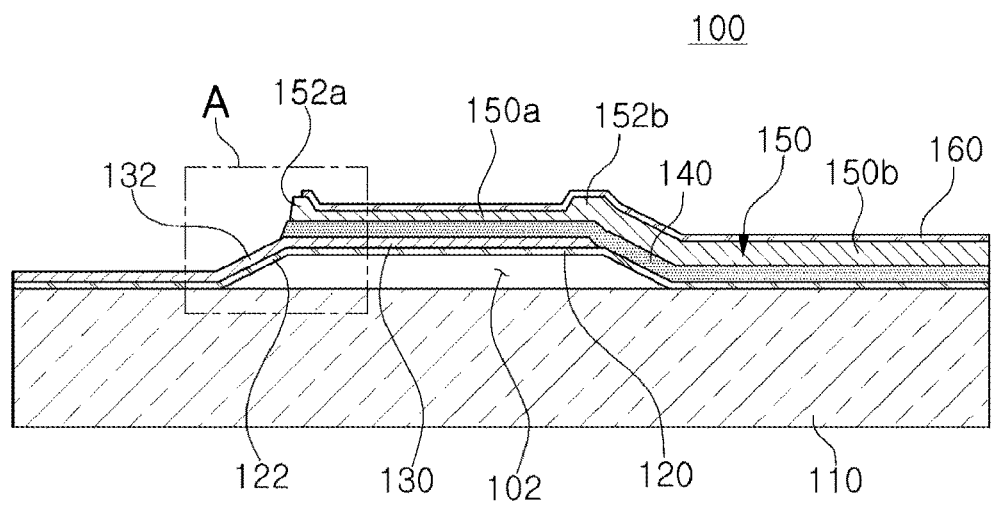
FIG. 1 is a schematic cross-sectional view illustrating an example of an acoustic wave filter device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
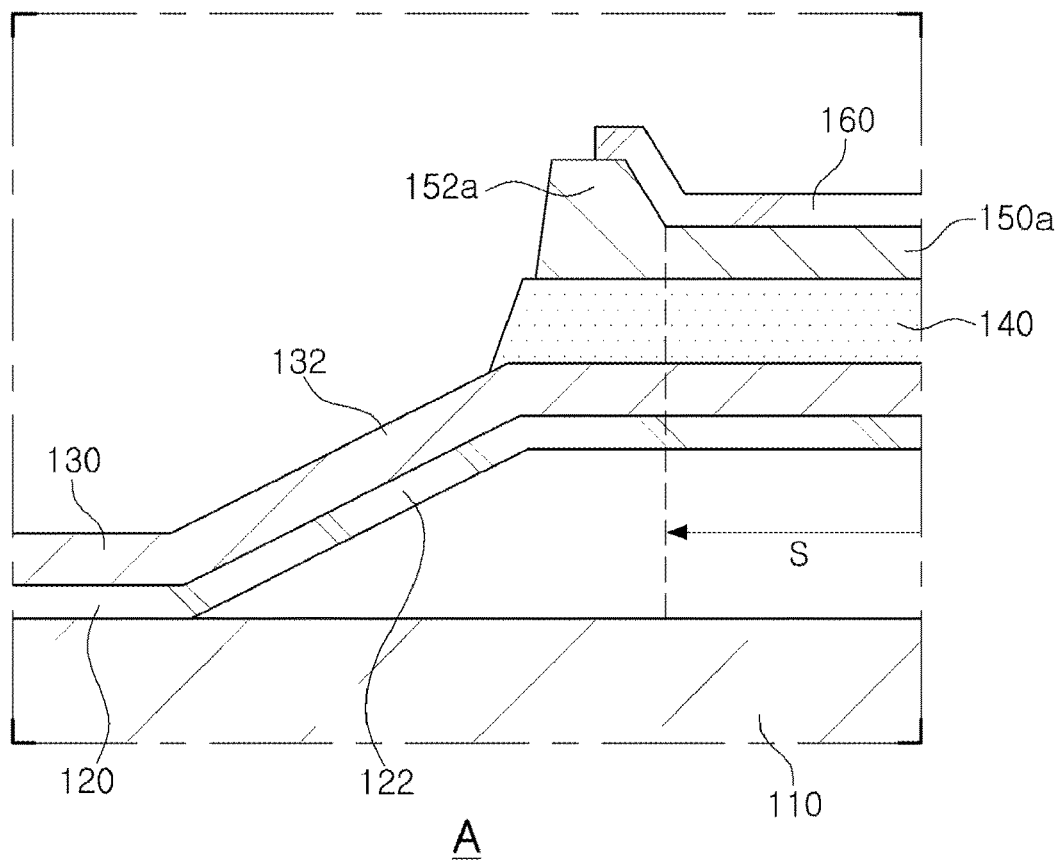
FIG. 2 is an enlarged partial view illustrating section A of FIG. 1.

FIG. 1 is a schematic cross-sectional view illustrating an example of an acoustic wave filter device, and FIG. 2 is an enlarged partial view illustrating section A of FIG. 1.

Referring to FIGS. 1 and 2, the acoustic wave filter device 100 includes a substrate 110, a lower electrode protecting layer 120, a lower electrode 130, a piezoelectric layer 140, an upper electrode 150, and an insulating layer 160.

The substrate 110 may be a substrate in which silicon is stacked. For example, a silicon wafer may be used as the substrate 110.

A cavity 102 is formed between the lower electrode protecting layer 120 and the substrate 110. To this end, the lower electrode protecting layer 120 includes an inclined portion 122. The cavity 102 may be formed by stacking a sacrificial layer (not illustrated) and then removing the sacrificial layer.

The lower electrode protecting layer 120 is formed below the lower electrode 130 and serves to prevent oxidation of the lower electrode 130 by a release process. In addition, the lower electrode protecting layer 120 may also serve as a reflection layer.

The lower electrode 130 is formed on the lower electrode protecting layer 120. As an example, the lower electrode 130 may be formed of a conductive material such as molybdenum (Mo), ruthenium (Ru), tungsten (W), or the like.

In addition, the lower electrode 130 is used as an input electrode inputting an electrical signal such as a radio frequency (RF) signal to the piezoelectric layer 140 and an output electrode. For example, in a case in which the lower electrode 130 is the input electrode, the upper electrode 150 may be the output electrode, and in a case in which the lower electrode 130 is the output electrode, the upper electrode 150 may be the input electrode.

In addition, the lower electrode 130 includes an inclined portion 132 corresponding to the inclined portion 122 of the lower electrode protecting layer 120 described above.

The piezoelectric layer 140 is formed on the lower electrode 130. In addition, the piezoelectric layer 140 converts the electrical signal input from the lower electrode 130 or the upper electrode 150 into acoustic waves.

As an example, in a case in which an electric field that changes over time is induced in the upper electrode 150, the piezoelectric layer 140 converts the electrical signal input from the upper electrode 150 into physical vibrations. In addition, the piezoelectric layer 140 converts the converted physical vibrations into the acoustic waves. In the current example, an electric field that changes over time is induced and the piezoelectric layer 140 generates bulk acoustic waves in the same direction as a thickness direction of the piezoelectric layer 140. As described above, the piezoelectric layer 140 generates the bulk acoustic waves that convert the electrical signal into the acoustic waves.

The upper electrode includes a first frame portion 152a, a second frame portion 152b, an extension portion 150a and an end portion 150b. The extension portion 150a extends between the first frame portion 152a and the second frame portion 152b. The end portion 150b extends from the second frame portion 152b. The insulating layer 160 is disposed on upper surfaces of the second frame portion, 152b, the extension portion 150a, the end portion 150b, and a partial upper surface of the first frame portion 152a.

The first and second frame portions 152a, 152b are formed to have a thickness greater than that of the active area of the upper electrode 150, and the insulating layer 160 is then deposited on the upper electrode 150 and the first and second frame portions 152a, 152b to implement a frequency trimming function of the bulk acoustic wave resonator.

The piezoelectric layer 140 may be formed by depositing aluminum nitride, zinc oxide, or lead zirconate titanate on the lower electrode 130.

The upper electrode 150 is formed on the piezoelectric layer 140 and may be formed of a conductive material such as molybdenum (Mo), ruthenium (Ru), tungsten (W), or the like, similar to the lower electrode 130.

The frame portions 152a and 152b each have a thickness greater than the extension portion 150a extending between the first frame portion 152a and the second frame portion 152b. The first and second frame portions 152a, 152b are formed of the same material as that of other portions of the upper electrode 150.

However, the first and second frame portions 152a, 152b are not limited thereto, and may be formed of a material different from that of other portions of the upper electrode 150.

As described above, the first and second frame portions 152a, 152b are formed on the upper electrode 150 to reflect lateral waves generated at a time of resonance in an active area, thereby trapping resonant energy in the active area.

The insulating layer 160 is formed on the upper electrode 150 and may be formed of an insulating material such as silicon oxide.

The insulating layer 160 serves to adjust the frequency of the acoustic wave filter device 100. In other words, the insulating layer 160 is stacked in order to determine a pass frequency band, and the pass frequency band may be determined by adjusting a thickness of the insulating layer 160 at the time of forming the insulating layer 160.

In addition, the insulating layer 160 exposes a portion of the upper electrode 150. As an example, the insulating layer 160 exposes portions of a side surface and an upper surface of the first frame portion 152a of the upper electrode 150.

A method of forming the insulating layer 160 will be briefly described. The insulating layer 160 is stacked on the upper electrode 150, and the piezoelectric layer 140 and the lower electrode 130 that are externally exposed. Then, the insulating layer 160 is removed so that portions of the side surface and the upper surface of the first frame portion 152a are exposed by performing additional patterning and then performing dry or wet etching.

That is, the insulating layer 160 is removed so that portions of the side surface and the upper surface of the first frame portion 152a are exposed. The insulating layer 160 formed on the exposed piezoelectric layer 140 and the exposed lower electrode 130 are also removed.

Therefore, reflection loss of the resonant energy generated due to lateral waves moving outwardly with respect to the first frame portion 152a at the time of resonance is reduced to improve the Q performance.

As described above, a frequency trimming function is implemented through the insulating layer 160 formed on the upper electrode 150.

In addition, the insulating layer 160 is formed to expose a portion of the first frame portion 152a in order to reduce the reflection loss of the resonant energy generated due to the lateral waves at the outer sides of the first frame portion 152a at a time of resonance, thereby improving Q performance.

Other examples in the present disclosure will hereinafter be described with reference to the drawings.

Figure 3:
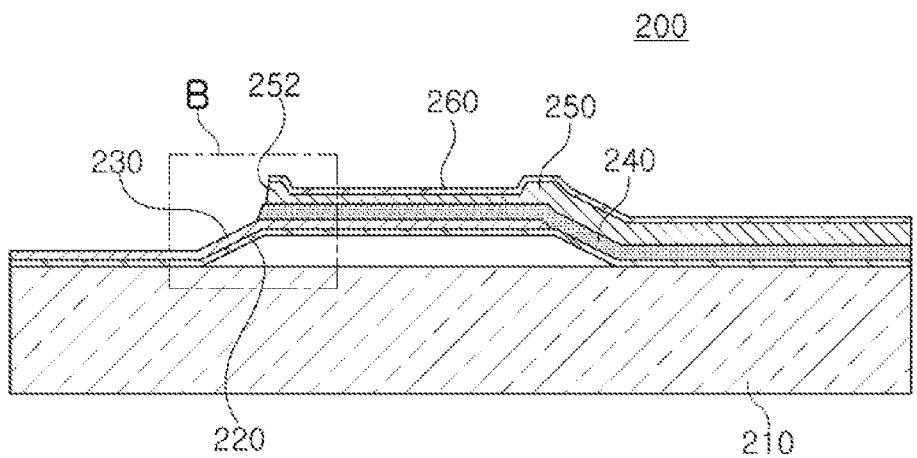
FIG. 3 is a schematic cross-sectional view illustrating another example of an acoustic wave filter device.
Figure 4:
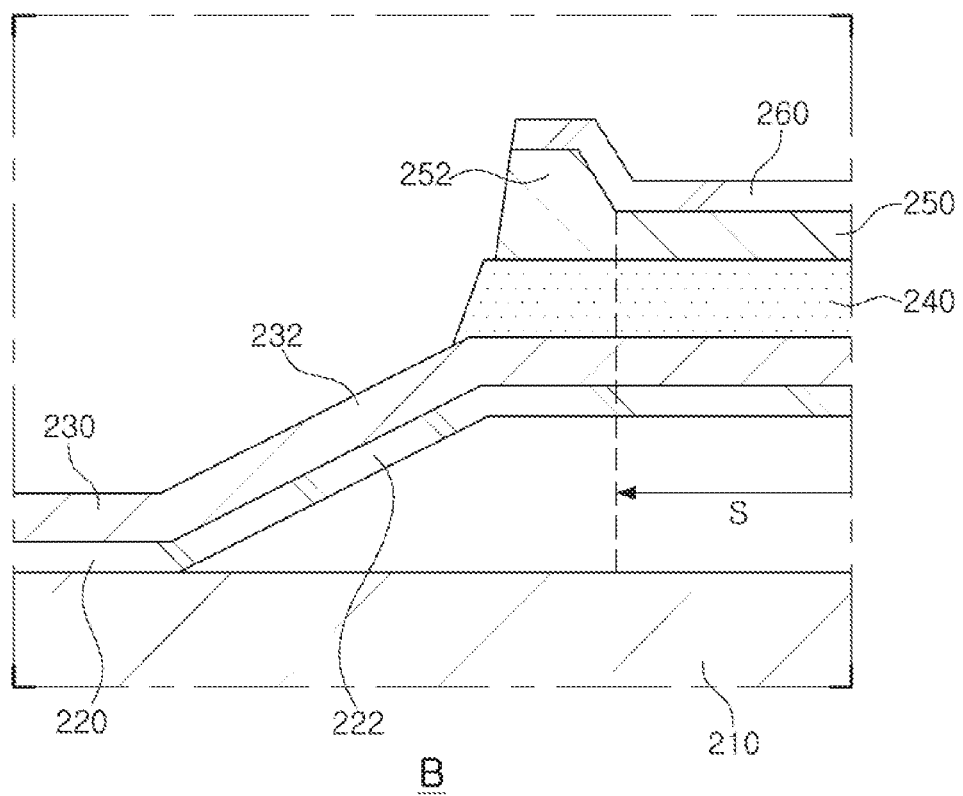
FIG. 4 is an enlarged partial view illustrating section B of FIG. 3.

FIG. 3 is a schematic cross-sectional view illustrating another example of an acoustic wave filter device, and FIG. 4 is an enlarged partial view illustrating portion B of FIG. 3.

Referring to FIGS. 3 and 4, the acoustic wave filter device 200 another example includes a substrate 210, a lower electrode protecting layer 220, a lower electrode 230, a piezoelectric layer 240, an upper electrode 250, and an insulating layer 260.

Since the substrate 210, the lower electrode protecting layer 220, the lower electrode 230, the piezoelectric layer 240, and the upper electrode 250 are the same as the substrate 110, the lower electrode protecting layer 120, the lower electrode 130, the piezoelectric layer 140, and the upper electrode 150, respectively, a detailed description of the elements will be omitted for brevity.

The insulating layer 260 is formed on the upper electrode 250. The insulating layer 260 may be formed of an insulating material such as silicon oxide.

The insulating layer 260 may serve to adjust the frequency of the acoustic wave filter device 200. In other words, the insulating layer 260 is stacked in order to determine a pass frequency band, and the pass frequency band is determined by adjusting a thickness of the insulating layer 260 at the time of forming the insulating layer 260.

In addition, the insulating layer 260 exposes a portion of the upper electrode 250. In this example, the insulating layer 260 exposes a side surface portion of a frame portion 252 of the upper electrode 250.

Here, a method of forming the insulating layer 260 will be briefly described. The piezoelectric layer 240 is formed on the lower electrode 230 and the lower electrode protecting layer 220, and the upper electrode 250 is formed on the piezoelectric layer 240.

Then, the insulating layer 260 is formed on the upper electrode 250, and may be patterned.

The patterned insulating layer 260 may be used as a mask to dry-etch or wet-etch and pattern the upper electrode 250 and pattern the piezoelectric layer 240.

Therefore, the insulating layer 260 exposes a side surface portion of the frame portion 252 of the upper electrode 250. That is, a distal end of the insulating layer 260 is disposed in parallel with the side surface of the frame portion 252.

As a result, reflection loss of resonant energy generated due to lateral waves moving outwardly with respect to the frame portion 252 at the time of resonance driving is reduced to improve Q performance.

As described above, a frequency trimming function may be implemented through the insulating layer 260 formed on the upper electrode 250.

In addition, the insulating layer 260 is formed to expose a portion of the frame portion 252 to reduce the reflection loss of the resonant energy generated due to the lateral waves at the outer side of the frame portion 252 at the time of resonance driving, thereby improving Q performance.

Figure 5:
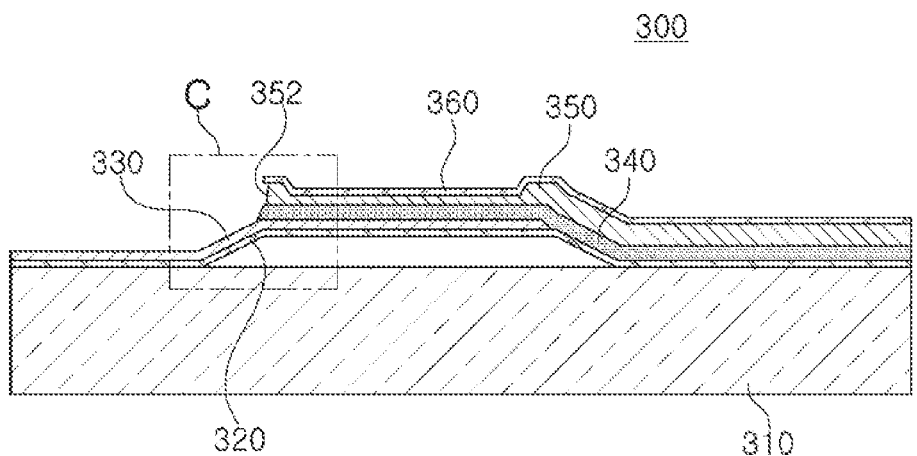
FIG. 5 is a schematic cross-sectional view illustrating another example of an acoustic wave filter device.
Figure 6:
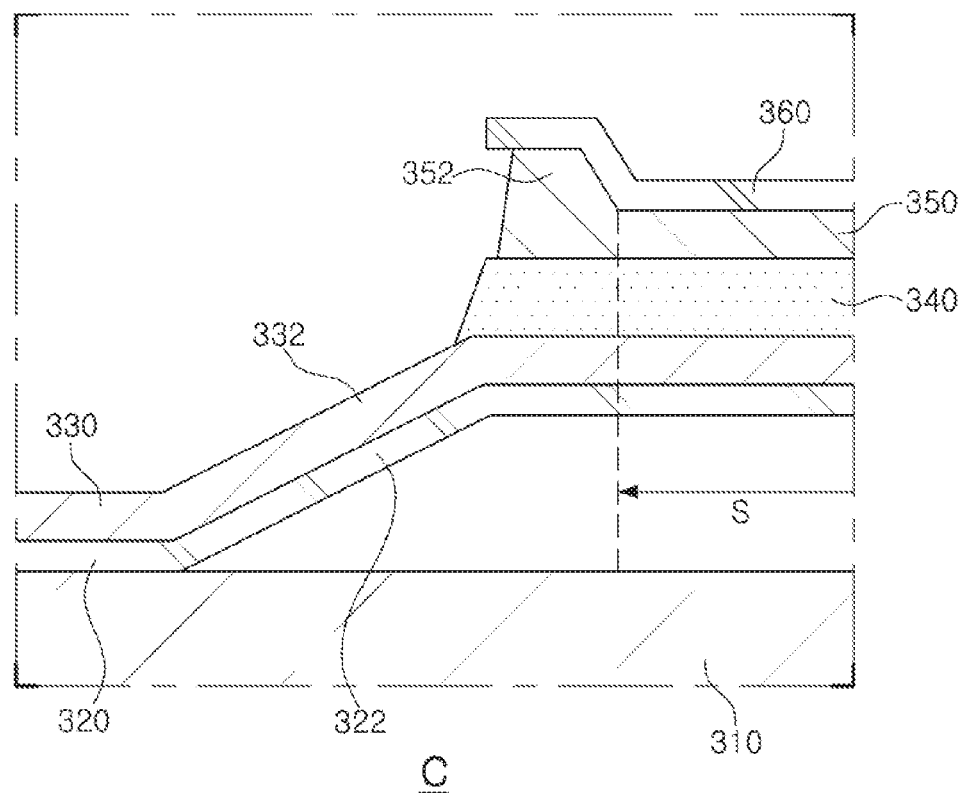
FIG. 6 is an enlarged partial view illustrating section C of FIG. 5.

FIG. 5 is a schematic cross-sectional view illustrating another example of an acoustic wave filter device, and FIG. 6 is an enlarged partial view illustrating portion C of FIG. 5.

Referring to FIGS. 5 and 6, the acoustic wave filter device 300 includes a substrate 310, a lower electrode protecting layer 320, a lower electrode 330, a piezoelectric layer 340, an upper electrode 350, and an insulating layer 360.

Since the substrate 310, the lower electrode protecting layer 320, the lower electrode 330, the piezoelectric layer 340, and the upper electrode 350 are the same as the substrate 110, the lower electrode protecting layer 120, the lower electrode 130, the piezoelectric layer 140, and the upper electrode 150, respectively, a detailed description therefor will be omitted for brevity.

The insulating layer 360 is formed on the upper electrode 350 and may be formed of an insulating material such as silicon oxide.

The insulating layer 360 serves to adjust a frequency. In other words, the insulating layer 360 is stacked in order to determine a pass frequency band, and the pass frequency band is determined by adjusting a thickness of the insulating layer 360 at the time of forming the insulating layer 360.

In addition, the insulating layer 360 exposes a portion of the upper electrode 350. As an example, the insulating layer 360 exposes a portion of a side surface of a frame portion 352 of the upper electrode 350. In addition, the insulating layer 360 is extended to protrude from the frame portion 352.

Here, a method of forming the insulating layer 360 will be briefly described. The piezoelectric layer 340 is formed on the lower electrode 330 and the lower electrode protecting layer 320, and the upper electrode 350 is formed on the piezoelectric layer 340.

Then, the insulating layer 360 is formed on the upper electrode 350, and may be patterned.

If patterned, the patterned insulating layer 360 is used as a mask to dry-etch or wet-etch and pattern the upper electrode 350 and the piezoelectric layer 340. In this case, the upper electrode 350 is patterned so that a distal end of the insulating layer 360 protrudes from the frame portion 352 of the upper electrode 350.

Therefore, the insulating layer 360 exposes a portion of the side surface of the frame portion 352 of the upper electrode 350.

As a result, reflection loss of resonant energy generated due to lateral waves moving outwardly with respect to the frame portion 352 at the time of resonance is reduced to improve Q performance.

Figure 7:
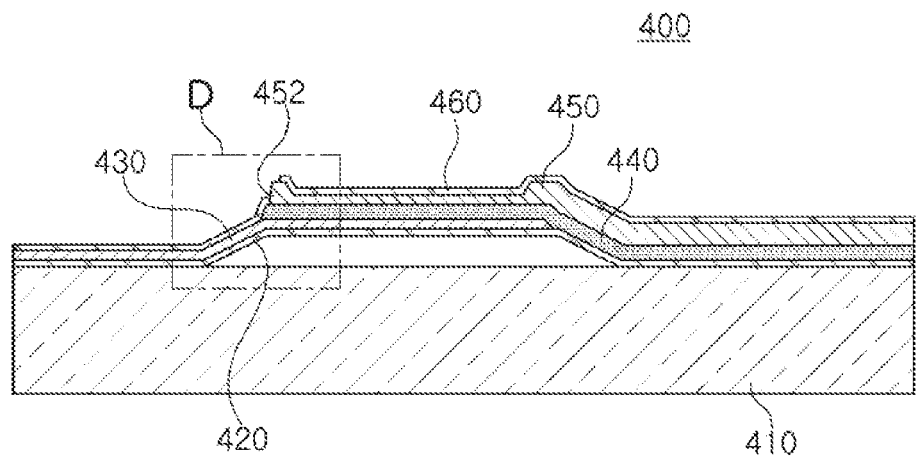
FIG. 7 is a schematic cross-sectional view illustrating another example of an acoustic wave filter device.
Figure 8:
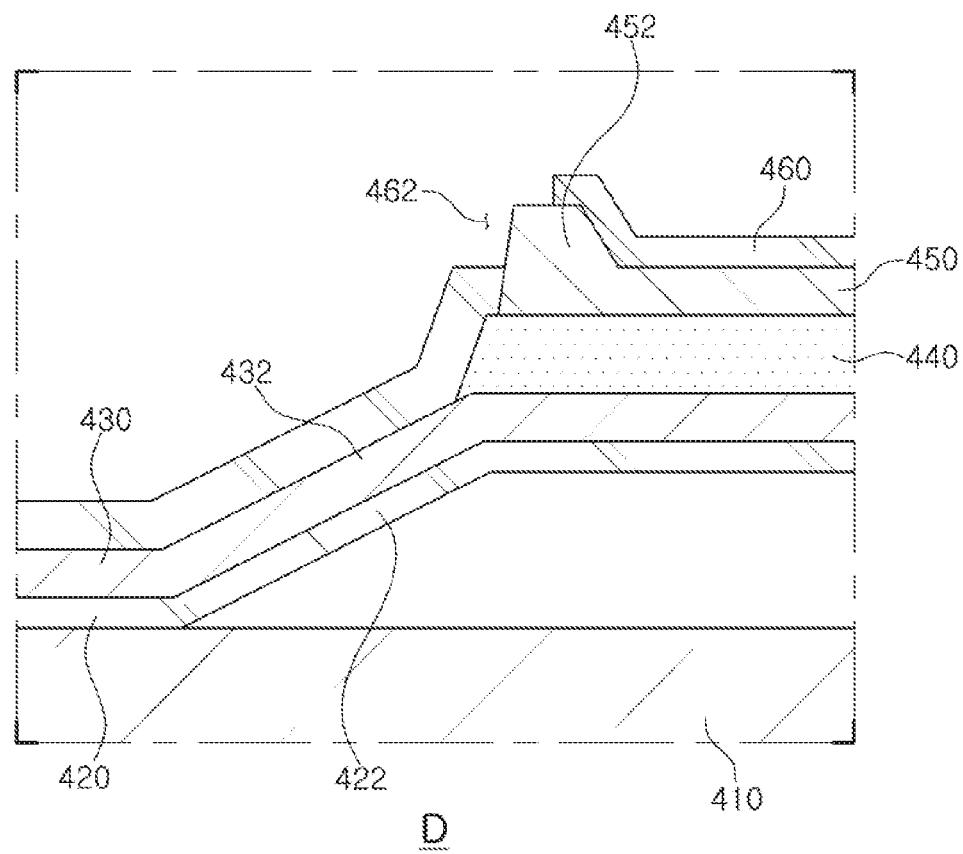
FIG. 8 is an enlarged partial view illustrating section D of FIG. 7.

FIG. 7 is a schematic cross-sectional view illustrating another example of an acoustic wave filter, and FIG. 8 is an enlarged partial view illustrating portion D of FIG. 7.

Referring to FIGS. 7 and 8, the acoustic wave filter device 400 includes a substrate 410, a lower electrode protecting layer 420, a lower electrode 430, a piezoelectric layer 440, an upper electrode 450, and an insulating layer 460.

Since the substrate 410, the lower electrode protecting layer 420, the lower electrode 430, the piezoelectric layer 440, and the upper electrode 450 are the same as the substrate 110, the lower electrode protecting layer 120, the lower electrode 130, the piezoelectric layer 140, and the upper electrode 150, respectively, a detailed description will be omitted for brevity.

The insulating layer 460 is formed to cover the lower electrode 430, an incline portion 432 extending from the lower electrode 430, the piezoelectric layer 440, the upper electrode 450, and portions of a frame portion 452 extending from the upper electrode 450. A case in which the insulating layer 460 is formed to cover the lower electrode 430, the piezoelectric layer 440, and the upper electrode 450 is described in the current example. However, the insulating layer 460 is not limited thereto. In other words, the insulating layer 460 may only be formed to cover the lower electrode 430 and the upper electrode 450.

The insulating layer 460 may be formed of an insulating material such as silicon oxide.

The insulating layer 460 serves to adjust a frequency. In other words, the insulating layer 460 is stacked in order to determine a pass frequency band, and the pass frequency band is determined by adjusting a thickness of the insulating layer 460 at the time of forming the insulating layer 460.

In addition, the insulating layer 460 exposes a portion of the upper electrode 450 through an exposure hole 462. As an example, the insulating layer 460 exposes portions of a side surface and an upper surface of a frame portion 452 of the upper electrode 450 through the exposure hole 462.

A method of forming the insulating layer 460 is briefly described below. The insulating layer 460 is stacked on the upper electrode 450 and the piezoelectric layer 440, and the lower electrode 430 is exposed externally before the insulating layer 460 is formed. In a case in which only the upper electrode 450 and the lower electrode 430 are exposed externally before the insulating layer 460 is formed, the insulating layer 460 is formed to cover the upper electrode 450 and the lower electrode 430. In addition, in a case in which portions of the lower electrode 430 and the piezoelectric layer 440 are exposed externally before the insulating layer 460 is formed, the insulating layer 460 is stacked on the lower electrode 430 and the piezoelectric layer 440 that are externally exposed, and the upper electrode 450.

Then, the insulating layer 460 is removed so that portions of the side surface and the upper surface of the frame portion 452 are externally exposed by performing additional patterning and then performing dry or wet etching.

That is, the exposure hole 462 is formed in the insulating layer 460 so that portions of the side surface and the upper surface of the frame portion 452 are externally exposed.

Therefore, reflection loss of the resonant energy generated due to lateral waves moving outwardly with respect to the frame portion 452 at the time of resonance driving is reduced to improve Q performance.

As described above, a frequency trimming function is implemented through the insulating layer 460 formed on the upper electrode 450.

In addition, the insulating layer 460 is formed to expose a portion of the frame portion 452 to reduce the reflection loss of the resonant energy generated due to the lateral waves at the outer side of the frame portion 452 at the time of resonance driving, thereby improving Q performance.

Figure 9:
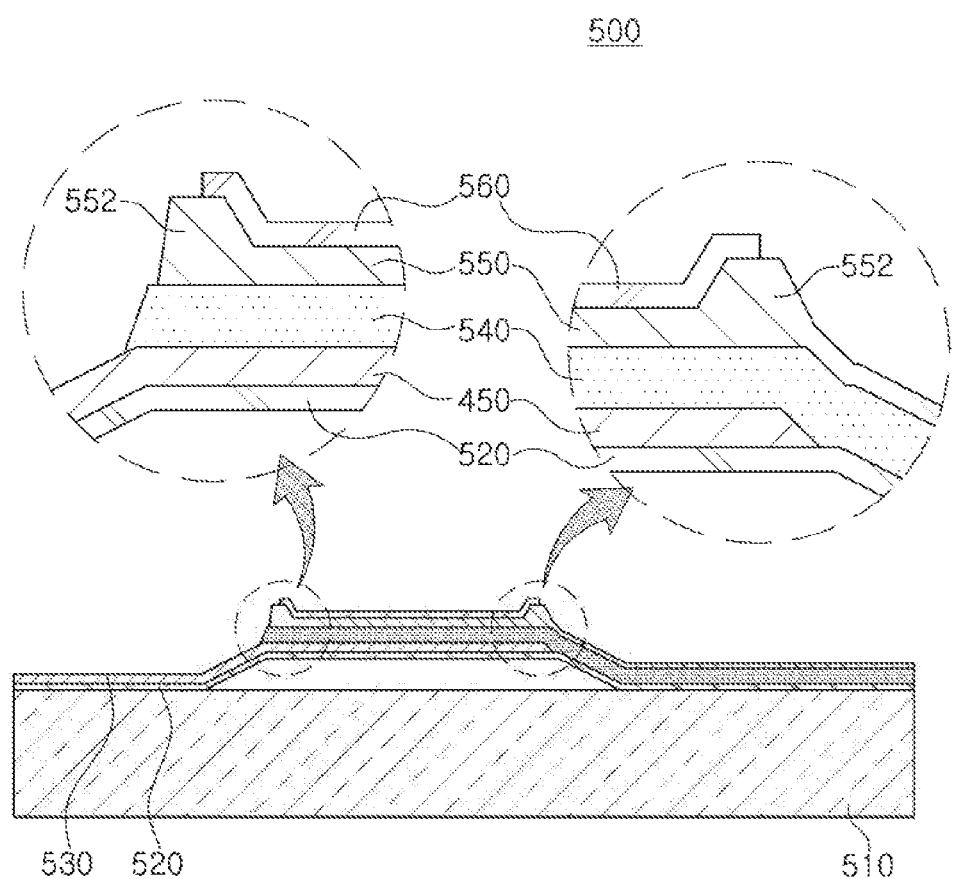
FIG. 9 is a schematic cross-sectional view illustrating another example of an acoustic wave filter device.

FIG. 9 is a schematic cross-sectional view illustrating an example of an acoustic wave filter device.

Referring to FIG. 9, the acoustic wave filter device 500 includes a substrate 510, a lower electrode protecting layer 520, a lower electrode 530, a piezoelectric layer 540, an upper electrode 550, and an insulating layer 560.

Since the substrate 510, the lower electrode protecting layer 520, the lower electrode 530, and the piezoelectric layer 540 are the same as the substrate 110, the lower electrode protecting layer 120, the lower electrode 130, and the piezoelectric layer 140, respectively, a detailed description will be omitted for brevity.

The upper electrode 550 is formed on the piezoelectric layer 540. As an example, the upper electrode 550 may be formed of a conductive material such as molybdenum (Mo), ruthenium (Ru), tungsten (W), or the like, similar to the lower electrode 530.

Meanwhile, a frame portion 552 having a thickness greater than that of other portions of the upper electrode 550 is formed at an edge of the upper electrode 550. The frame portion 552 is formed of the same material as that of other portions of the upper electrode 550.

However, the frame portion 552 is not limited thereto, and may be formed of a material different from that of other portions of the upper electrode 550.

As described above, the frame portion 552 is formed at the edge of the upper electrode 550 to reflect lateral waves generated at the time of resonance in an active area, thereby trapping resonant energy in the active area.

Further, the frame portion 552 described above may have a band shape, i.e., an encircling contour. As an example, the frame portion 552 has a band shape corresponding to a shape of the active area in which the resonance is generated. The active area is an area in which the resonance is generated, and may have an approximately amorphous circular shape, oval shape, polygonal shape (for example, a pentagonal shape or a quadrangular shape), or the like, when viewed from the top.

The insulating layer 560 is formed on the upper electrode 550. The insulating layer 560 may be formed of an insulating material such as silicon oxide.

The insulating layer 560 serves to adjust a frequency. In other words, the insulating layer 560 is stacked in order to determine a pass frequency band, and the pass frequency band is determined by adjusting a thickness of the insulating layer 560 at the time of forming the insulating layer 560.

In addition, the insulating layer 560 exposes a portion of the upper electrode 550. As an example, the insulating layer 560 exposes portions of a side surface and an upper surface of the frame portion 552, having the band shape, of the upper electrode 550.

A method of forming the insulating layer 560 is briefly described below. The insulating layer 560 is stacked on the upper electrode 550, and the piezoelectric layer 540 and the lower electrode 530 that are externally exposed. Then, the insulating layer 560 is removed so that portions of the side surface and the upper surface of the frame portion 552 are exposed by performing additional patterning and then dry or wet etching.

That is, the insulating layer 560 is removed so that portions of the side surface and the upper surface of the frame portion 552 are exposed. The insulating layer 560 formed on the piezoelectric layer 540 and the lower electrode 530 that are externally exposed is also removed.

Therefore, reflection loss of resonant energy generated due to lateral waves moving outwardly with respect to the frame portion 552 at the time of resonance driving is reduced to improve Q performance.

As described above, a frequency trimming function is implemented through the insulating layer 560 formed on the upper electrode 550.

In addition, the insulating layer 560 may be formed to expose a portion of the frame portion 552 to reduce the reflection loss of the resonant energy generated due to the lateral waves at the outer side of the frame portion 552 at the time of resonance driving, thereby improving Q performance.

As set forth above, according to the examples in the present disclosure, deterioration of performance due to reflection loss may be suppressed.

As a non-exhaustive example only, a terminal/device/unit as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. An acoustic wave filter device comprising:
a lower electrode disposed between a substrate and a piezoelectric layer;
an upper electrode disposed on the piezoelectric layer, and comprising a first frame portion, a second frame portion, an extension portion disposed between the first frame portion and the second frame portion, and an end portion extending from the second frame portion; and an insulating layer disposed on an upper surface of the first frame portion, an upper surface of the second frame portion, an upper surface of the extension portion, and an upper surface of the end portion, wherein the insulating layer exposes portions of a side surface and the upper surface of the first frame portion.

2. The acoustic wave filter device of claim 1, wherein the first frame portion and the second frame portion have thicknesses greater than a thickness of the extension portion.

3. The acoustic wave filter device of claim 2, wherein the first frame portion, the second frame portion, the extension portion, and the end portion are formed of a same material.

4. The acoustic wave filter device of claim 1, further comprising: a lower electrode protecting layer disposed between the lower electrode and the substrate.

5. The acoustic wave filter device of claim 4, wherein a cavity is formed between the lower electrode protecting layer and the substrate, and the piezoelectric layer is disposed on a portion of the lower electrode protecting layer.

6. The acoustic wave filter device of claim 5, wherein the cavity is formed by removing a sacrificial layer.

7. The acoustic wave filter device of claim 5, wherein the lower electrode protecting layer and the lower electrode have inclined portions.

8. An acoustic wave filter device, comprising:

a lower electrode disposed between a substrate and a piezoelectric layer to form a cavity between the lower electrode and the substrate;

an upper electrode disposed on the piezoelectric layer, the upper electrode comprising a first frame portion, a second frame portion, an extension portion and an end portion, wherein the extension portion extends between the first frame portion and the second frame portion, and the end portion extends from the second frame portion; and an insulating layer disposed on upper surfaces of the second frame portion, the extension portion, the end portion, and a partial upper surface of the first frame portion.

9. The acoustic wave filter device of claim 8, wherein the insulating layer exposes a side surface of the first frame portion.

10. The acoustic wave filter device of claim 8, wherein the insulating layer exposes side and upper surfaces of the first frame portion.

11. The acoustic wave filter device of claim 8, wherein the first and second frame portions each have a thickness greater than the extension portion.

* * * * *